(12) United States Patent
Kwon

(10) Patent No.: US 8,198,659 B2
(45) Date of Patent: Jun. 12, 2012

(54) SEMICONDUCTOR DEVICE AND METHOD FOR FABRICATING THE SAME

(75) Inventor: Kyung-Wook Kwon, Daiseo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/620,803

(22) Filed: Nov. 18, 2009

(65) Prior Publication Data

US 2010/0127311 A1    May 27, 2010

(30) Foreign Application Priority Data

Nov. 21, 2008   (KR) .................. 10-2008-0116089

(51) Int. Cl.
*H01L 29/76* (2006.01)
(52) U.S. Cl. ......... 257/288; 257/E21.409; 257/E29.255; 257/E21.473; 438/373; 438/376; 438/514; 438/519; 438/275; 438/305
(58) Field of Classification Search .................. None
See application file for complete search history.

(56) References Cited

U.S. PATENT DOCUMENTS

| | | | | |
|---|---|---|---|---|
| 5,159,427 A | * | 10/1992 | Ogura et al. | 257/500 |
| 6,507,068 B2 | * | 1/2003 | Takahashi | 257/315 |
| 7,919,390 B2 | * | 4/2011 | Eun | 438/435 |
| 2001/0016399 A1 | * | 8/2001 | Linn et al. | 438/455 |
| 2002/0008295 A1 | * | 1/2002 | Yang et al. | 257/413 |
| 2002/0028568 A1 | * | 3/2002 | Ueno et al. | 438/514 |
| 2006/0102928 A1 | * | 5/2006 | Nakamura | 257/147 |
| 2008/0157091 A1 | * | 7/2008 | Shin et al. | 257/66 |

FOREIGN PATENT DOCUMENTS

KR   10-2003-0021905   3/2003

\* cited by examiner

*Primary Examiner* — Fei Fei Yeung Lopez
(74) *Attorney, Agent, or Firm* — Sherr & Vaughn, PLLC

(57) ABSTRACT

A semiconductor device and a method of manufacturing a semiconductor device. A method of manufacturing a semiconductor device may include forming a gate electrode over a semiconductor substrate, a second conductive type ion implantation region at opposite sides of a gate electrode, a second conductive type ion implantation region as a first conductive type second ion implantation region by implanting a first conductive type impurity over opposite sides of said gate electrode, and/or forming a first conductive type first ion implantation region that substantially surrounds a first conductive type second ion implantation region. A method of manufacturing a semiconductor device may form an N type MOSFET and/or a P type MOSFET using a single photolithography process for each N+ source/drain photolithography process and/or P+ source/drain photolithography process.

7 Claims, 3 Drawing Sheets

SEMICONDUCTOR DEVICE AND METHOD FOR FABRICATING THE SAME

Figure 1:
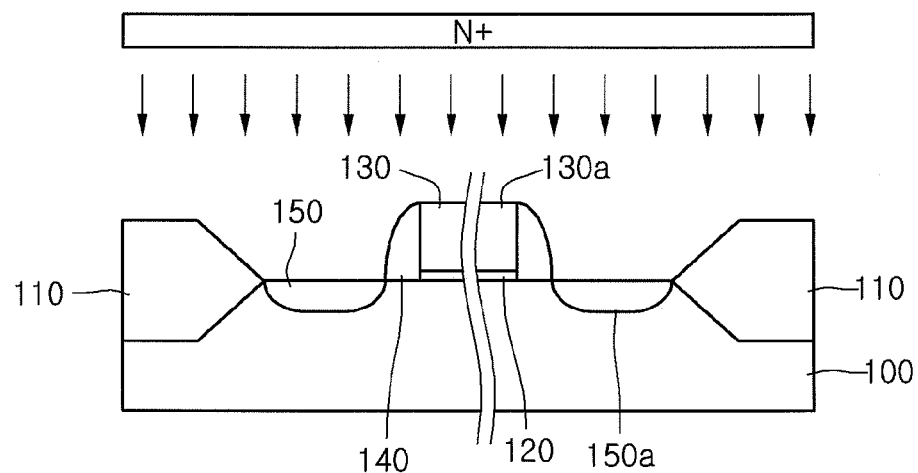

The present application claims priority under 35 U.S.C. 119 to Korean Patent Application No. 10-2008-0116089 (filed on Nov. 21, 2008) which is hereby incorporated by reference in its entirety.

BACKGROUND

Embodiments relate to a semiconductor device and a method of manufacturing a semiconductor device In a metal oxide semiconductor (MOS) transistor, which may include a field effect transistor (FET), a gate oxide layer and/or a gate electrode may be formed on and/or over a silicon semiconductor substrate. A source and/or drain region may be formed on and/or over a semiconductor substrate at opposite sides of a gate electrode. Lightly doped drain (LDD) regions having a relatively low concentration may be formed on and/or over inner sides of a source and/or drain region. A MOS transistor may be divided into an N type MOS transistor and/or a P type transistor according to the type of channel. Each channel of MOS transistors may be formed on and/or over a single semiconductor substrate. A MOS transistor may relate to a complementary metal oxide semiconductor (CMOS) transistor.

In order to fabricate source and/or drain regions of a MOSFET, each of a N+ source/drain photolithography process and/or a P+ source/drain photolithography process may be performed on and/or over a N type MOSFET and/or a P type MOSFET. Accordingly, in semiconductor technology, there is a need for maximizing process costs through a process simplification, and/or a need for maximizing integration.

SUMMARY

Embodiments relate to a semiconductor device and a method of manufacturing a semiconductor device whose process may be simplified. According to embodiments, a semiconductor device and a method of manufacturing a semiconductor device may reduce the relative number of processes and/or may form, for example, a PMOS transistor and/or a NMOS transistor.

Embodiments relate to a semiconductor device. According to embodiments, a semiconductor device may include a gate electrode that may be formed on and/or over a semiconductor substrate. In embodiments, a semiconductor device may include a first conductive type first ion implantation region that may be formed at opposite sides of a gate electrode. In embodiments, a semiconductor device may include a first conductive type second ion implantation region that may be formed on and/or over a first conductive type ion implantation region, and/or may include a lower concentration than a first conductive type first ion implantation region. In embodiments, a semiconductor device may include a salicide layer that may be formed on and/or over an upper surface of a gate electrode, and/or on and/or over a first ion implantation region and/or a second ion implantation region.

Embodiments relate to a method of manufacturing a semiconductor device. According to embodiments, a method of manufacturing a semiconductor device may include forming a gate electrode on and/or over a semiconductor substrate. In embodiments, a method of manufacturing a semiconductor device may include forming a second conductive type ion implantation region at opposite sides of a gate electrode. In embodiments, a method of manufacturing a semiconductor device may include forming a second conductive type ion implantation region as a first conductive type second ion implantation region by, for example, implanting a first conductive type impurity on and/or over opposite sides of a gate electrode, and/or forming a first conductive type first ion implantation region that may substantially surround a first conductive type second ion implantation region.

Embodiments relate to a semiconductor device. According to embodiments, a semiconductor device may include a first gate electrode and/or a second gate electrode that may be formed on and/or over a semiconductor substrate. In embodiments, a semiconductor device may include a first conductive type first ion implantation region that may be formed at opposite sides of a first gate electrode. In embodiments, a semiconductor device may include a first conductive type second ion implantation region that may be formed on and/or over a first conductive type first ion implantation region, and/or may include a lower concentration than a first conductive type first ion implantation region. In embodiments, a semiconductor device may include a second conductive type ion implantation region that may be formed at opposite sides of a second gate electrode. In embodiments, a semiconductor device may include a salicide layer that may be formed on and/or over an upper surface of a first and/or second gate electrode, and/or on and/or over a second conductive type ion implantation region, a first ion implantation region and/or a second ion implantation region.

Embodiments relate to a method of manufacturing a semiconductor device. According to embodiments, a method of manufacturing a semiconductor device may include forming first and/or second gate electrodes on and/or over a semiconductor substrate. In embodiments, a method of manufacturing a semiconductor device may include forming first and/or second gate spacers at side walls of a first and/or second gate electrode, respectively. In embodiments, a method of manufacturing a semiconductor device may include implanting a second conductive type impurity on and/or over a semiconductor substrate using first and/or second gate electrodes, and/or first and/or second gate spacers, as a mask. In embodiments, a method of manufacturing a semiconductor device may include forming a mask on and/or over a region including a second gate electrode and/or a second gate spacer, and/or etching a portion of a first gate spacer to expose a portion of a semiconductor substrate which may be under a first gate spacer. In embodiments, a method of manufacturing a semiconductor device may include implanting a first conductive type impurity on and/or over a semiconductor substrate using a mask, and/or a etched first gate spacer and/or first gate electrode as a mask. In embodiments, a method of manufacturing a semiconductor device may include removing a mask, and/or forming a salicide layer on and/or over an exposed semiconductor substrate and/or an upper surface of a first and/or second gate electrode.

DRAWINGS

Example FIG. 1 to FIG. 5 are cross-sectional views illustrating a method of manufacturing a semiconductor device in accordance with embodiments.

DESCRIPTION

Embodiments relate to a semiconductor device and a method of manufacturing a semiconductor device. Referring to example FIG. 5, a diagram illustrates a semiconductor device in accordance with embodiments. According to embodiments, a semiconductor device may include an NMOS transistor region and/or a PMOS transistor region on and/or over semiconductor substrate 100. In embodiments, source and/or drain regions of a NMOS transistor may be substantially symmetrical with each other with reference to gate electrode 130, such that substantially half of an NMOS transistor and/or substantially half of a PMOS transistor may be illustrated.

According to embodiments, device isolation layers 110 and/or 110*a* may be formed on and/or over semiconductor substrate 100. In embodiments, device isolation layers 110 and/or 110*a* may define active areas on and/or over which transistors may be formed. In embodiments, device isolation layers 110 and/or 110*a* may be formed by local oxidation of silicon (LOCOS) and/or shallow trench isolation (STI).

According to embodiments, for an NMOS transistor for example, gate dielectric layer 120 may be formed on and/or over semiconductor substrate 100. In embodiments, gate electrode 130 may be formed on and/or over gate dielectric layer 120. In embodiments, first gate spacer 140 may be formed at a side wall of gate dielectric layer 120 and/or gate electrode 130. In embodiments, N+ type impurity may be implanted on and/or over semiconductor substrate 100, for example at a side surface of first gate spacer 140. In embodiments, N+ type ion implantation region 150 may be formed. In embodiments, N+ type ion implantation region 150 may operate as a source and/or drain region of an NMOS transistor. In embodiments, salicide layer 170 may be formed on and/or over a gate electrode and/or N+ type ion implantation region 150.

According to embodiments, for a PMOS transistor for example, gate dielectric layer 120 may be formed on and/or over semiconductor substrate 100. In embodiments, gate electrode 130 may be formed on and/or over gate dielectric layer 120. In embodiments, second gate spacer 140*a* may be formed at a side wall of gate dielectric layer 120 and/or gate electrode 130. In embodiments, second gate spacer 140*a* may be formed by being overetched compared to first spacer 140 of an NMOS transistor.

According to embodiments, a width of second gate spacer 140*a* may be smaller than a width of first gate spacer 140. In embodiments, a height of second gate spacer 140*a* may be smaller than a height of first gate spacer 140. In embodiments, second device isolation layer 110*a* in a PMOS transistor region may be smaller than first isolation layer 110 in an NMOS transistor region. In embodiments, a width of second device isolation layer 110*a* in a PMOS transistor region may be smaller than a width of first isolation layer 110. In embodiments, a height of second device isolation layer 110*a* may be smaller than a height of first device isolation layer 110. In embodiments, sizes of trenches gap-filled with first and/or second device isolation layers 110 and/or 110*a* may be substantially the same such that an upper surface of semiconductor substrate 110 may be further exposed, for example by second device isolation layer 110*a*.

According to embodiments, P+ type impurity may be implanted on and/or over semiconductor substrate 100, for example at a side surface of second gate spacer 140*a*. In embodiments, P+ type ion implantation region 160 may be formed. In embodiments, P+ type ion implantation region 160 may operate as a source and/or drain region of an NMOS transistor. In embodiments, P− type ion implantation region 150*c*, which N+ type ion implantation region may be counter-doped, may be formed on and/or over P+ type ion implantation region 160. In embodiments, P+ type ion implantation region 160 may be formed in a shape to substantially surround P− type ion implantation region 150*c*.

According to embodiments, P+ type ion implantation region 160 may contact second gate spacer 140*a* and/or each edge of second device isolation layer 110*a*. In embodiments, N+ type ion implantation region formed before being counter-doped may be formed during a process of forming N+ type ion implantation region 150, for example to form a source and/or drain region of an NMOS transistor. In embodiments, a salicide layer 170 may be formed on and/or over gate electrode 130 and/or P+ type ion implantation region 160.

According to embodiments, dielectric layer 180 may substantially cover an NMOS transistor and/or a PMOS transistor, and/or may be formed on and/or over semiconductor substrate 100. According to embodiments, a contact hole may be formed on and/or over dielectric layer 180, and/or may expose a source and/or drain region of an NMOS transistor and/or gate electrode 130. In embodiments, a contact hole may be formed on and/or over dielectric layer 180, and/or may expose a source and/or drain region of a PMOS transistor and/or gate electrode 130. In embodiments, barrier layer 181 and/or contact electrode 183 may be formed on and/or over a contact hole. In embodiments, metal wiring 185 may be connected electrically to contact electrode 183, and/or may be formed on and/or over dielectric layer 180.

Embodiments relate to a method of manufacturing a semiconductor device. Referring to example FIG. 1 to FIG. 5, cross-sectional views illustrate a method of manufacturing a semiconductor device in accordance with embodiment. Referring to FIG. 1, device isolation layer 110 may be formed, for example using a shallow trench isolation (STI) method, on and/or over a predetermined portion of semiconductor substrate 100 having an NMOS transistor region and/or a PMOS transistor region. According to embodiments, device isolation layer 110 may define an active region of an NMOS and/or a PMOS transistor region.

According to embodiments, an oxide layer may be formed on and/or over semiconductor substrate 100, on and/or over which device isolation layer 110 may be formed. In embodiments, gate dielectric layer 120 may be formed. In embodiments, a polysilicon may be deposited on and/or over gate dielectric layer 120, for example to form a gate electrode layer. In embodiments, a gate electrode layer and/or a gate dielectric layer may be etched. In embodiments, each gate electrode 130 and/or gate dielectric layer 120 of an NMOS transistor and/or a PMOS transistor may be formed.

According to embodiments, a N lightly doped drain (NLDD) region and/or a P lightly doped drain (PLDD) region may be formed on and/or over an active region of an NMOS transistor and/or an active region of a PMOS transistor, for example using each photolithography process. In embodiments, a NLDD may be formed by implanting low-concentration N type impurity on and/or over semiconductor substrate 100, for example using gate electrode 130 of an NMOS transistor as a mask. At substantially the same time, a PMOS transistor region may be masked, for example using photoresist pattern 190.

According to embodiments, a PLDD may be formed by implanting low-concentration P type impurity on and/or over semiconductor substrate 100, for example using gate electrode 130 of a PMOS transistor as a mask. In embodiments, at substantially the same time, an NMOS transistor region may be masked, for example using photoresist pattern 190. In embodiments, an ONO layer, or any layer, may be formed on and/or over semiconductor substrate 100 over which gate electrode 130 may be formed. In embodiments, gate spacer 140 may be formed at a side wall of gate electrode 130, for example through an anisotropic etching process such as a reactive ion etching.

Referring back to FIG. 1, a blank N+ implant process may be performed on and/or over semiconductor substrate 100, over which gate electrode 130 and/or gate spacer 140 may be formed. In embodiments, spacer 140 may be formed at a side wall of gate electrode 130. In embodiments, N+ type impurity may be implanted on and/or over semiconductor substrate 100 substantially without a photolithography process. In embodiments, for an NMOS transistor and/or a PMOS transistor, N+ type ion implantation region 150 may be formed on and/or over semiconductor substrate 100 using gate electrode 130 and/or gate spacer 140 as an ion implantation mask.

Figure 2:
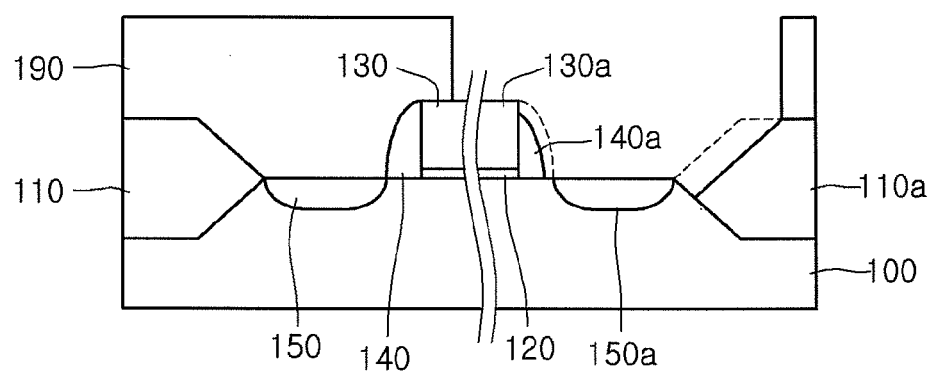

Referring to FIG. 2, photoresist pattern 190 may substantially cover a NMOS transistor region, and/or may be formed on and/or over semiconductor substrate 100. In embodiments, gate spacer 140 and/or device isolation layer 110 in a PMOS transistor region may be partially etched using photoresist pattern 190 as an etching mask. In embodiments, gate spacer 140 and/or device isolation layer 110 may include a silicon oxide layer, such that they may be simultaneously etched during substantially the same etching process. Embodiment are not limited to performing a single etching process, but an additional etching process may be processed. In embodiments, a nitride layer etching process may be added to etch a nitride layer of a gate spacer, for example.

According to embodiments, a size of device isolation layer 110 and/or gate spacer 140 of an NMOS may be substantially different than a size of device isolation layer 110a and/or gate spacer 140a of a PMOS transistor. In embodiments, device isolation layer 110 and/or gate spacer 140 of an NMOS transistor may relate to a first device isolation layer and/or a first gate spacer, respectively. In embodiments, device isolation layer 110a and/or gate spacer 140a of a PMOS transistor may relate to a second device isolation layer and/or a second gate spacer, respectively. In embodiments, second gate spacer 140a may be formed at a side wall of gate dielectric layer 120 and/or gate electrode 130.

According to embodiments, second gate spacer 140a may be formed to be overetched compared to first gate spacer 140 of an NMOS transistor. In embodiments, a width of second gate spacer 140a may be smaller than a width of first gate spacer 140. In embodiments, a height of second gate spacer 140a may be smaller than a height of first gate spacer 140. In embodiments, second device isolation layer 110a on and/or over a PMOS transistor region may be smaller than first device isolation layer 110 on and/or over NMOS transistor region. In embodiments, a width of second gate spacer 110a on and/or over PMOS transistor region may be smaller than a width of first device isolation layer 110. In embodiments, a height of second device isolation layer 110a may be smaller than a height of first device isolation layer 110.

According to embodiments, the sizes of trenches gap-filled with first and/or second device isolation layers 110 and/or 110a may be substantially the same. In embodiments, an upper surface of semiconductor substrate 110 may be further exposed, for example by second device isolation layer 110a. In embodiments, upper portions of trenches may be partially exposed, for example by etching second device isolation layer 110a.

Figure 3:
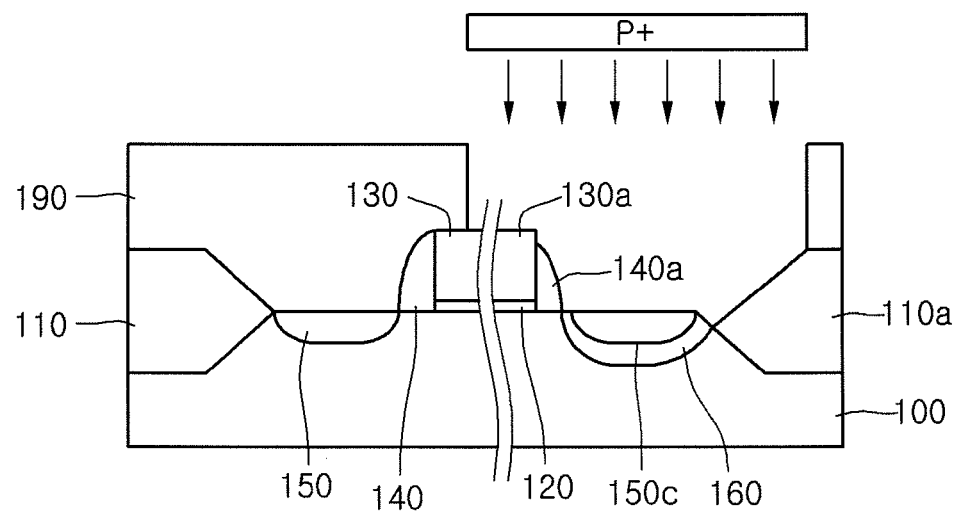

Referring to FIG. 3, a P+ type ion implantation region may be formed on and/or over an active region. According to embodiments, P+ type impurity may be on and/or over PMOS transistor region, for example using a photoresist pattern which may be formed on and/or over an NMOS transistor region as an ion implantation mask. In embodiments, for example in a PMOS transistor, sizes of second device isolation layer 110a and/or second gate spacer 140a may be reduced. In embodiments, P+ type ion implantation region may be formed by implanting P+ type impurity on and/or over semiconductor substrate 100 relatively more exposed by second gate spacer 140a and/or second device isolation layer 110a. In embodiments, a P+ type ion implantation region may be operated as a source and/or a drain region of a PMOS transistor.

According to embodiments, P− type ion implantation region 150c may be formed on and/or over P+ type ion implantation region 160 as N+ type ion implantation region 150a may be counter doped. In embodiments, semiconductor substrate 100 additionally exposed through etching may form P+ type ion implantation region 160. In embodiments, second gate spacer 140a and/or P− type ion implantation region 150c may be spaced from each other, and/or P+ type ion implantation region 160 may be formed therebetween. In embodiments, P− type ion implantation region 150c and/or second gate spacer 140a may be spaced from each other, and/or P+ type ion implantation region 160 may be formed therebetween. In embodiments, P+ type ion implantation region 160 may be formed in a shape to substantially surround P− type ion implantation region 150c.

Figure 4:
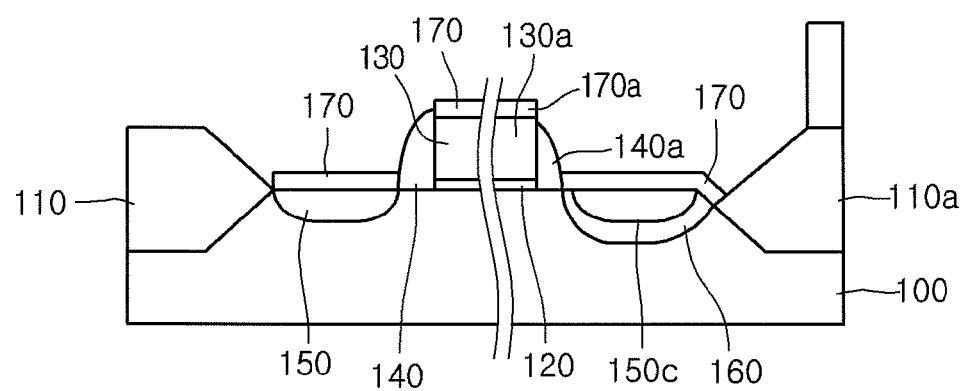

Referring to FIG. 4, a metal layer may be formed for salicide on and/or over semiconductor substrate 100. In embodiments, salicide layer 170 may be formed on and/or over an upper surface of gate electrode 130, and/or an upper surface of semiconductor substrate 100 in a source and/or drain region, for example through an annealing process, and the like. In embodiments, for example in a PMOS transistor, P− type ion implantation region 150c and/or P+ type ion implantation region 160, which may substantially surround P− type ion implantation region 150c, may be connected electrically to each other by salicide layer 170. In embodiments, during a process of forming P− type ion implantation region 150c using a counter doping method, N+ type impurity and/or P+ type impurity to be implanted may not be completely counter doped but may form a PN diode. In embodiments, characteristic deterioration may be minimized and/or change in contact resistance may be minimized.

Figure 5:
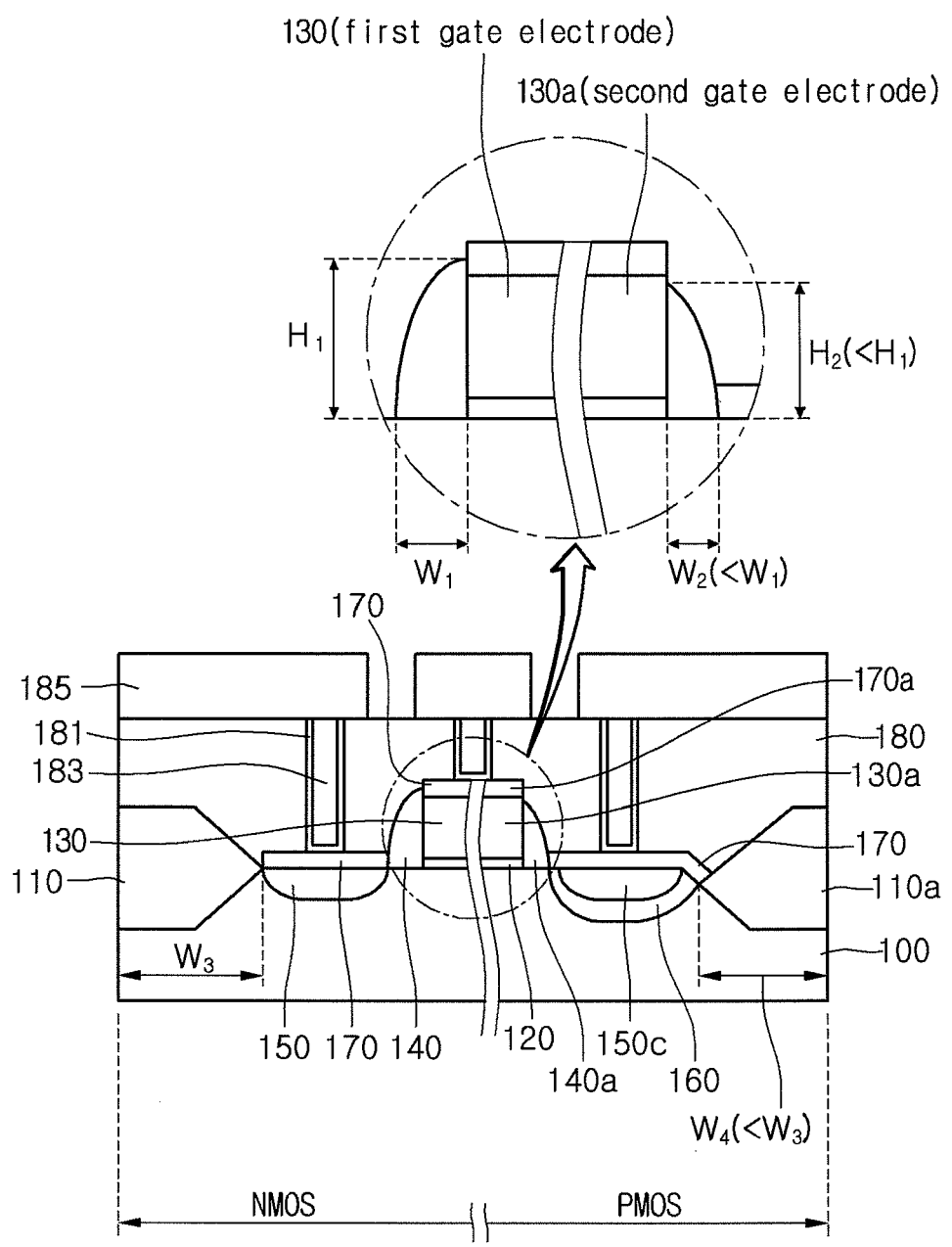

Referring to FIG. 5, dielectric layer 180 may substantially cover an NMOS transistor. According to embodiments, a PMOS transistor may be formed on and/or over semiconductor substrate 100. In embodiments, a contact hole may be formed on and/or over dielectric layer 180, and/or may expose a source and/or drain region of an NMOS transistor and/or gate electrode 130. In embodiments, a contact hole may be formed on and/or over dielectric layer 180, and/or may expose a source and/or drain region of a PMOS transistor and/or a gate electrode. In embodiments, barrier layer 181 and/or contact electrode 183 may be formed on and/or over a contact hole. In embodiments, metal wiring 185 may be connected electrically to contact electrode 183, and/or may be formed on and/or over dielectric layer 180.

According to embodiments, contact electrode 183 may be connected to source and/or drain regions of a PMOS transistor, and/or may be formed on and/or over P− type ion implantation region 150c. In embodiments, at substantially the same time, a contact resistance may be minimized by salicide layer 170 which may be formed between contact electrode 183 and P− type ion implantation region 150c. In embodiments, a semiconductor device may include a PMOS transistor whose structure may be slightly changed, but it may also be applied to a NMOS transistor.

According to embodiments, a semiconductor device and a method of manufacturing a semiconductor device may form a NMOS transistor and/or a PMOS transistor on and/or over a semiconductor substrate. In embodiments, a semiconductor device and a method of manufacturing a semiconductor device may minimize the number of processes, maximize yield and/or minimize fabricating costs. In embodiments, a method of manufacturing a semiconductor device may form a N type MOSFET and/or a P type MOSFET using a single photolithography process for each N+ source/drain photolithography process and/or P+ source/drain photolithography process. In embodiments, process costs may be minimized through a process simplification.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising: a gate electrode of a transistor over a semiconductor substrate; a first conductive type second ion implantation region forming two separate wells at sides of said gate electrode; a first conductive type first ion implantation region forming a source or a drain of the transistor and surrounding one of the wells of said first conductive type second ion implantation region, wherein said first conductive type second ion implantation region comprises a lower concentration than said first conductive type first ion implantation region; a gate spacer at sidewalls of said gate electrode, said gate spacer and said first conductive type second ion implantation region spaced from each other, wherein a portion of said first conductive type first ion implantation region is interposed between said gate spacer and said first conductive type second ion implantation region; a first device isolation layer that is gap-filled in a trench formed over said semiconductor substrate, said first device isolation layer and said first conductive type second ion implantation region spaced from each other, wherein said first conductive type first ion implantation region contacts said gate spacer and each edge of said device first isolation layer; and a salicide layer over at least one of an upper surface of said gate electrode, over said first ion implantation region and said second ion implantation region.

2. The apparatus of claim 1, comprising:
said gate electrode as a first gate electrode;
a second gate electrode over said semiconductor substrate;
a second conductive type ion implantation region at sides of said second gate electrode; and
said salicide layer over at least one of an upper surface of said second gate electrode and said second conductive type ion implantation region.

3. The apparatus of claim 2, comprising:
a first gate spacer at side walls of said first gate electrode; and
a second gate spacer at side walls of said second gate electrode, said first gate spacer and said first conductive type second ion implantation region spaced from each other.

4. The apparatus of claim 3, wherein at least one of a width and a height of said first gate spacer is smaller than at least one of a width and a height of said second gate spacer.

5. The apparatus of claim 2, comprising: a first device isolation layer around said first gate electrode; and a second device isolation layer around said second gate electrode, said first device isolation layer and said first conductive type second ion implantation region spaced from each other, and wherein the first device isolation layer is around said first gate electrode.

6. The apparatus of claim 5, wherein at least one of a width of said first device isolation layer is smaller than at least one of a width of said second device isolation layer.

7. The apparatus of claim 5, wherein an upper portion of a trench of said first device isolation layer is partially exposed by said first device isolation layer.

* * * * *